United States Patent [19]
Schrantz et al.

[11] Patent Number: 5,272,104
[45] Date of Patent: Dec. 21, 1993

[54] BONDED WAFER PROCESS INCORPORATING DIAMOND INSULATOR

[75] Inventors: Gregory A. Schrantz; Jack H. Linn; Richard W. Belcher, all of Melbourne, Fla.

[73] Assignee: Harris Corporation, Melbourne, Fla.

[21] Appl. No.: 29,860

[22] Filed: Mar. 11, 1993

[51] Int. Cl.$^5$ .......................................... H01L 21/76
[52] U.S. Cl. ........................... 437/63; 437/62; 437/974; 437/100; 148/DIG. 12; 148/DIG. 135
[58] Field of Search ............ 437/62, 974, 63, 100; 148/DIG. 12, DIG. 135; 257/77

[56] References Cited

U.S. PATENT DOCUMENTS

| | | | |
|---|---|---|---|
| 4,981,818 | 1/1991 | Anthony et al. | 437/100 |
| 5,131,963 | 7/1992 | Ravi | 437/974 |
| 5,173,761 | 12/1992 | Dreifus et al. | 257/77 |
| 5,186,785 | 2/1993 | Annamalai | 437/235 |

FOREIGN PATENT DOCUMENTS 0206118 8/1990 Japan .

Primary Examiner—Brian E. Hearn
Assistant Examiner—Trung Dang
Attorney, Agent, or Firm—Ferdinand M. Romano; Charles C. Krawczyk

[57] ABSTRACT

A semiconductor-on-insulator structure incorporating a layer of diamond material and method for preparing such. The structure comprises a layer containing diamond material and having a first surface. A layer of silicon nitride is formed on the first surface and a layer of semiconductor material is positioned over the silicon nitride layer. In one embodiment of the method there is provided a removable deposition surface. A layer of crystalline diamond material is formed on the deposition surface. A first surface of the diamond material is separated from the deposition surface. The structure is useful for formation of integrated circuits thereon.

17 Claims, 10 Drawing Sheets

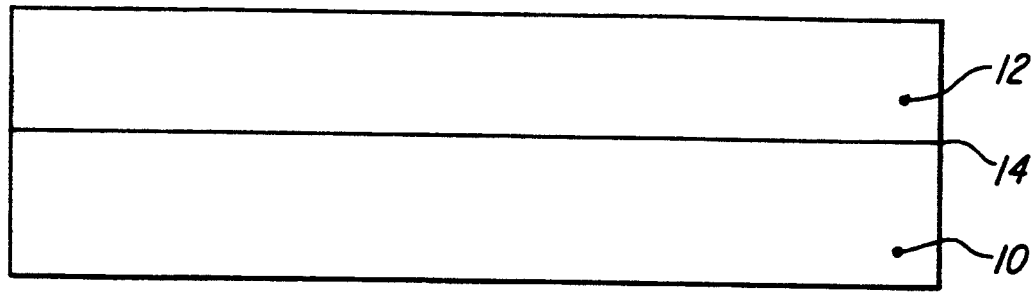
FIG. IA
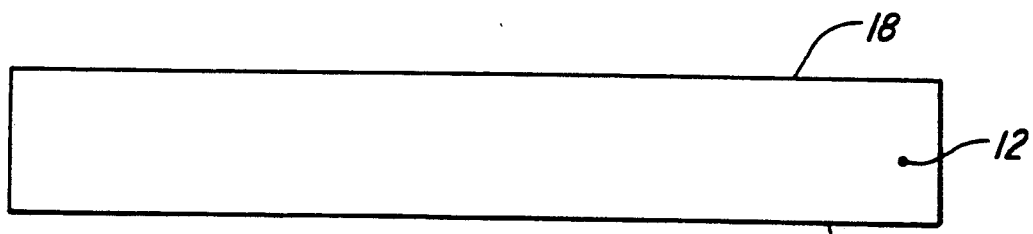
FIG. IB
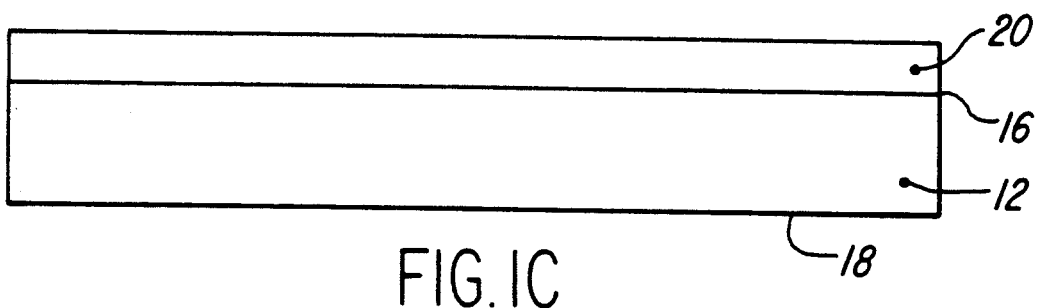
FIG. IC
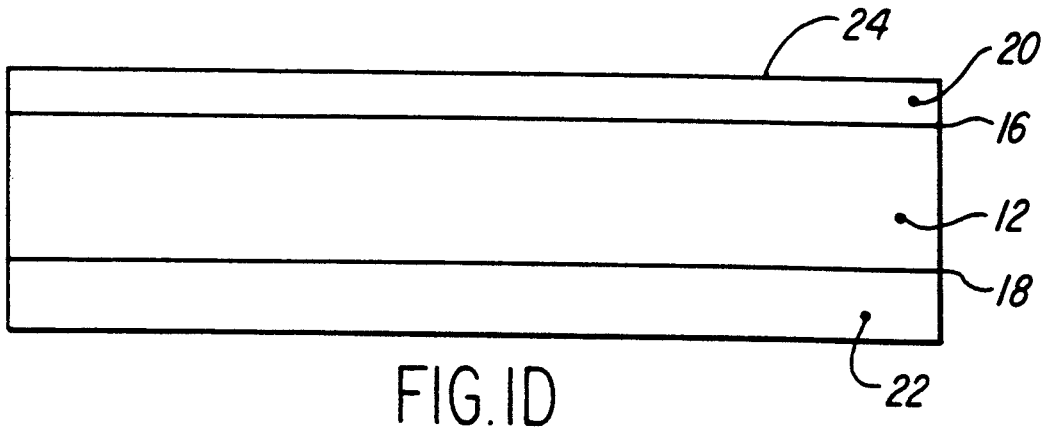
FIG. ID

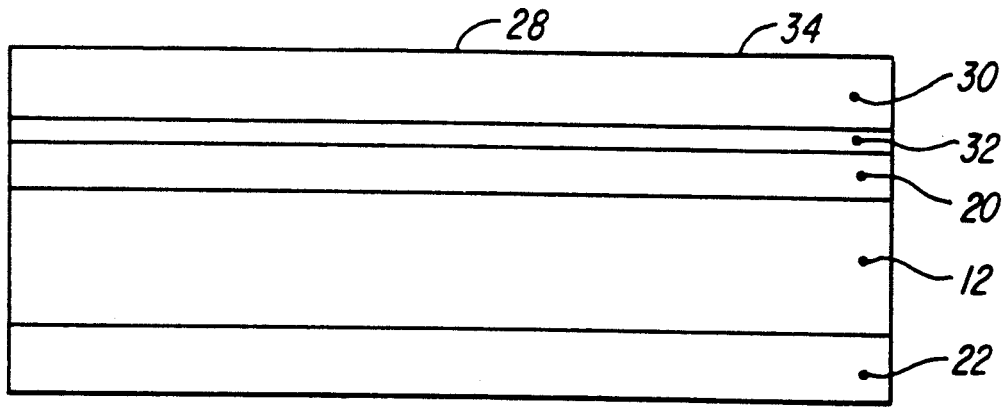
FIG. IE
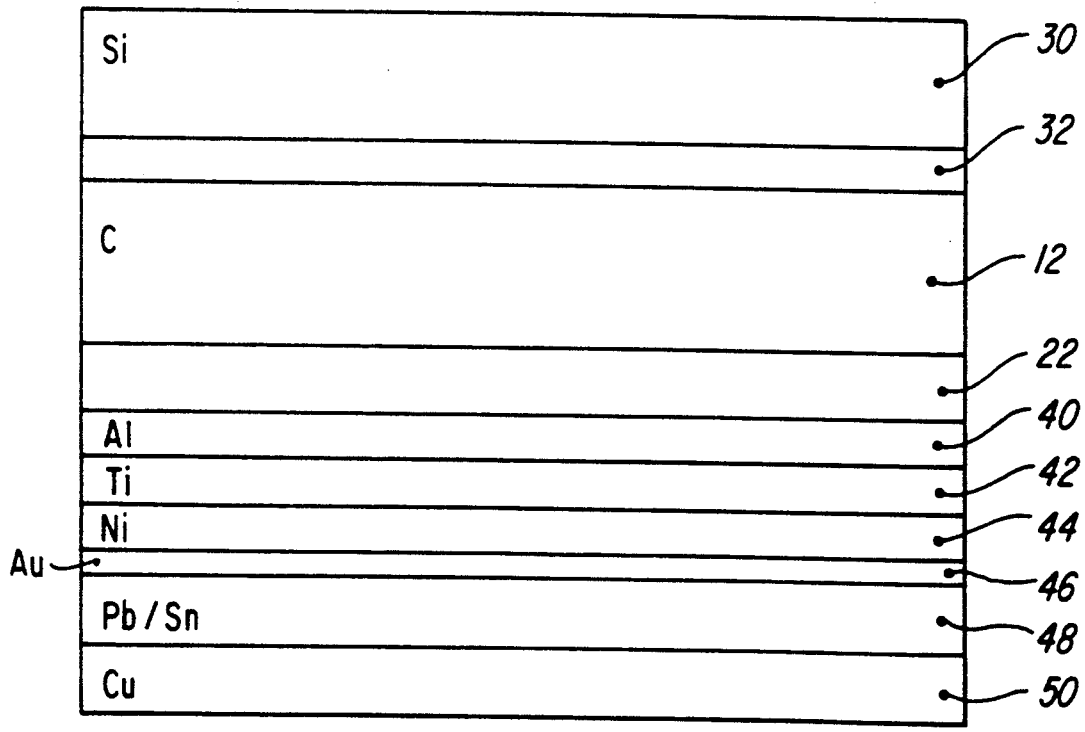
FIG. IF

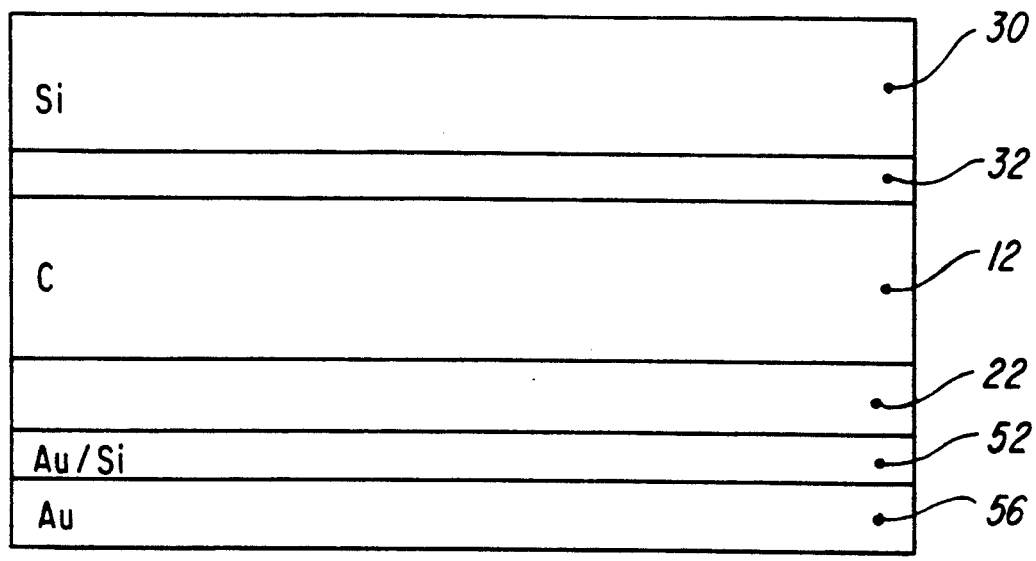
FIG. IG
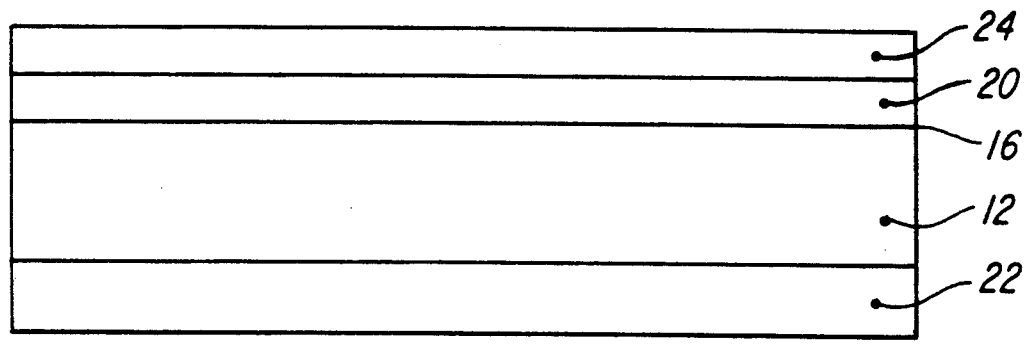
FIG. IH
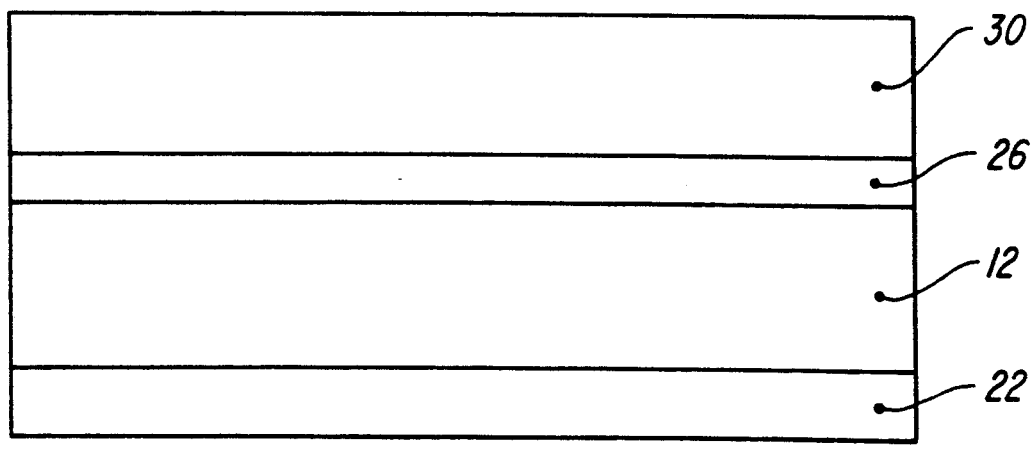
FIG. II

BONDED WAFER PROCESS INCORPORATING DIAMOND INSULATOR

FIELD OF THE INVENTION

The present invention relates to integrated electronic circuitry fabricated in semiconductor-on-insulator structures and, more particularly, to improved silicon-on-diamond circuits and methods of fabricating such structures.

BACKGROUND AND SUMMARY OF THE INVENTION

It is known that diamond material possesses desirable mechanical, electrical and thermal properties for application to integrated circuitry. See U.S. patent application Ser. No. 07/789,219, "Silicon On Diamond Circuit Structure" filed Nov. 7, 1991, assigned to the assignee of the present application, which discloses a method for forming an integrated circuit structure having a layer of crystalline silicon formed over a diamond layer. Among other applications, such a structure is useful for providing heat dissipation paths of enhanced thermal conductivity. Resulting advantages include increased power handling capability and higher levels of device integration.

More generally, integrated circuits fabricated on semiconductor-on-insulator (SOI) structures offer performance advantages including freedom from latchup for CMOS circuits, low parasitic capacitance, low power consumption, radiation hardness, high temperature operation, high voltage operation and the possibility of multi-layer device integration. Commonly, in SOI structures, device islands are formed by extending isolation trenches through the device semiconductor layer down to an insulation level. Sidewalls for such trenches are formed with an insulator such as silicon dioxide.

Fabrication of silicon-on-diamond structures may begin with preparation of a wafer growth substrate for receiving a polycrystalline diamond film thereover. After deposition of the diamond material, e.g., by Plasma Enhanced Chemical Vapor Deposition (PECVD), a thin polycrystalline or amorphous silicon film is formed over the diamond layer, perhaps to a thickness of less than one micron. Next, the silicon film is prepared to provide a smooth bonding surface for receiving a second wafer. The second wafer includes a semiconductor layer of suitable quality for formation of integrated circuit devices thereon. Further details are disclosed in Ser. No. 789,219 now incorporated herein by reference. Generally, the wafer substrate upon which the diamond film is grown becomes an integral part of the SOI structure.

For the above-reference process, deposition conditions must be carefully chosen to assure adhesion of the diamond film to the wafer substrate and to minimize warpage of the substrate once the diamond deposition is complete. Subsequent processing to form integrated circuit devices on the SOI structure has limited the choice of growth substrate materials to those compatible with the processing environment.

It is now recognized that the optimal film characteristics desired for application of diamond as a buried insulator in an SOI structure are not necessarily consistent with the characteristics imposed by the growth substrate bonded thereto. For example, due to differences in materials properties, e.g., thermal expansion characteristics, thermal cycling may limit the variety of wafer substrate types which are compatible with the formation of diamond layers.

To acquire improved characteristics there is now provided a method for preparing a semiconductor-on-insulator structure beginning with provision of a removable deposition surface and formation of diamond material thereon. The resulting diamond layer includes first and second opposing surfaces with the first surface initially in contact with the deposition surface. The first surface of the diamond layer is separated from the deposition surface. A bond is formed between one of the diamond surfaces and a wafer structure comprising a layer of semiconductor material.

Structures and methods are also provided for protecting the integrity of diamond material during semiconductor processing and for preventing diffusion of carbon from the diamond material into another layer of a semiconductor structure. Generally, an integrated circuit structure comprises a layer of diamond, a layer of silicon nitride formed on the diamond and a layer of semiconductor material over the nitride layer. According to one embodiment of the invention, the structure may be fabricated by first depositing a layer of diamond material and forming silicon nitride over the layer. A layer or wafer of semiconductor material is bonded to the diamond layer with the nitride layer positioned at the interface. Alternately, after depositing the diamond-containing layer and bonding a semiconductor layer to the diamond layer, trenches are formed through the semiconductor material to the diamond layer and silicon nitride is deposited in the trenches.

BRIEF DESCRIPTION OF THE FIGURES

FIGS. 1A–1I illustrate fabrication of a silicon-on-diamond circuit structure according to the invention;

DETAILED DESCRIPTION OF THE INVENTION

Figure 2:
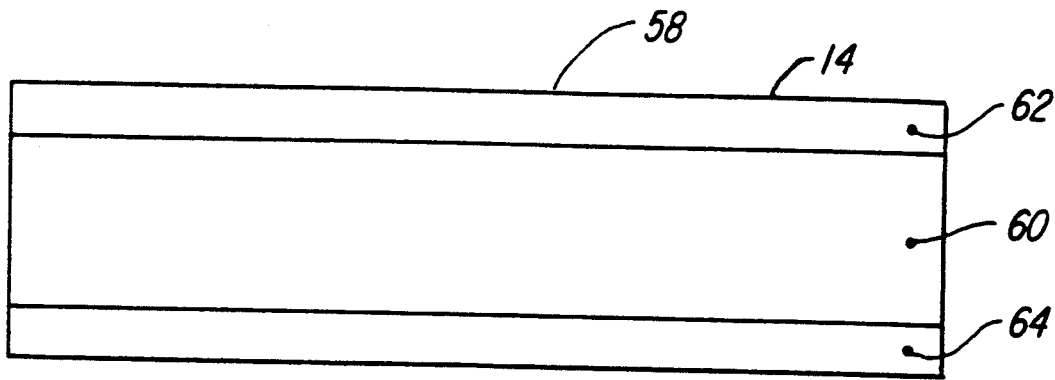
FIG. 2 illustrates a growth substrate for receiving polycrystalline diamond material.

FIGS. 1(A–F) illustrate one embodiment of the inventive concept. Initially a sacrificial substrate 10 of silicon carbide (SiC) is selected as a medium upon which a diamond film is grown. In this preferred embodiment SiC is chosen for the growth substrate 10 because it exhibits thermal expansion characteristics relatively close to those of the diamond film to be grown thereover, thus reducing the likelihood of incurring deleterious effects during temperature cycling. Having selected a substrate with desired characteristics for thermal cycling and for influencing both nucleation and surface growth, a polycrystalline diamond film is deposited on the substrate 10. The film is grown to sufficient thickness to provide necessary integrity for a free-standing diamond wafer and to avoid warpage problems.

As illustrated in FIG. 1A a diamond layer 12 is deposited over a growth surface 14 of the substrate 10. Deposition may be performed by Hot Filament Chemical Vapor Deposition (HFCVD) at a substrate temperature in the range of 700 to 1000 C. This results in a fairly uniform composition of polycrystalline diamond. Note, when the substrate surface 14 is polished to a desired specification, the resulting diamond surface 16 (see also FIG. 1B) formed against the substrate will exhibit a substantially equivalent degree of planarity or flatness. Thus surface 16 can provide a greater degree of uniformity and planarity than the opposing diamond surface 18 without grinding or polishing the diamond material.

The composite structure is next subjected to an appropriate chemical environment for removal of the substrate 10. For example, with a SiC substrate the free-standing diamond wafer of FIG. 1B is formed by dipping the structure in a bath of KOH heated to 60 C. to completely remove the SiC.

The newly exposed diamond surface 16, formerly against the substrate surface 14, is of superior quality for subsequent wafer bonding. Alternately, as previously known, one would first planarize and then bond the surface 18 in order to join the diamond layer 12 to a device-quality layer. Here, in addition to providing the high quality surface 16, the opposing surface 18 of the now free-standing diamond layer 12 may be polished to provide a desired overall uniformity in thickness and flatness. Of course this polishing could be performed prior to removal of the substrate 10. Such precision is desirable when providing a very thin semiconductor film over each of the surfaces 16 and 18 in order to build submicron integrated circuit devices on both sides of the insulative diamond layer 12.

Next an intermediate bonding layer is formed over the diamond surface 16. For example, deposit approximately 500 Angstroms of polysilicon or amorphous silicon on the newly exposed smooth diamond surface 16 by low pressure chemical vapor deposition (LPCVD) at a temperature in the range of 600 C. FIG. 1C illustrates the diamond layer of FIG. 1B inverted with such a deposited silicon layer 20 formed thereover. Subsequently, a second layer 22 of silicon film is deposited on the diamond surface 18. Formation of the second layer 22, although not essential, is desirable, among other reasons, to facilitate die attachment during later processing. See FIG. 1D which illustrates a two micron thick polysilicon film deposited by LPCVD, again in the temperature range of 600 C., to provide this die-attach layer 22. The resulting laminate structure 24 can next be bonded to a layer of, or wafer comprising, device-quality semiconductor material.

The structure 24 is more versatile and functional than prior materials and composites which have been bonded to device-quality semiconductor layers. Formerly, device wafers were bonded to what was termed a "handle" wafer in order to assure mechanical integrity during subsequent thermal processing and wafer handling. In contrast, the laminate structure 24 comprises a diamond layer which, in addition to protecting the integrity of an adjoining device layer, provides high thermal conductivity and dielectric isolation in relation to subsequently formed electronic devices. Moreover, the structure 24 may be formed in a manner which influences the electrical characteristics of both the diamond and the interfacial region between the diamond and the device layer.

FIG. 1E illustrates a bonded wafer 28 comprising a monocrystalline silicon, device-quality wafer 30 attached through the intermediate silicon layer 20 to the diamond layer 12. As used herein, the term monocrystalline implies a lattice structure, with or without defects or impurities. Bonding between the wafer 30 and the layer 20 should be preceded by a prebond surface treatment consisting of, for example, an $H_2SO_4/H_2O_2$ cleaning followed by a second cleaning with $NH_4OH$ and a spin rinse/dry. Enhanced bonding between the silicon layer 20 and the bonding surface of the wafer 30 may be had by formation of oxide at the interface 32. For example, inclusion of a liquid oxidant, such as water, in a high temperature anneal, e.g., above 900 C., in a neutral ambient or steam environment for several hours results in an oxygen bond between lattice silicon and polycrystalline silicon. For further details see U.S. Pat. No. 4,962,062 issued Oct. 9, 1990, incorporated herein by reference. See, also, U.S. patent application Ser. No. 07/834,439, assigned to the assignee of the present invention, disclosing a preferred liquid oxidant for enhancing bonded wafer yield.

Generally, a drop of liquid oxidant such as water plus hydrogen peroxide is placed on one of the bonding surfaces. Next, the device wafer is placed against the wafer structure 28. The drop of oxidant should have a volume in the range of 0.8 to 8 micro liters per square inch of wafer surface. Once the wafer 30 is positioned against the wafer structure 28, the contacting materials are allowed to dry for 24 to 48 hours. Next the contacting wafers are reacted at 900 C. for two hours to form silicon-oxygen bonds which fuse the wafers together. Once bonding is complete, the exposed surface 34 of the device wafer 30 may be cleaned and treated for further processing. Often it is desirable to thin the wafer 30 after bonding. It may also be desirable to initially implant the wafer 30 with complementary dopants for subsequent formation of CMOS circuitry. The wafer 30 may further incorporate a higher quality crystal of desired purity by epitaxial growth over the surface 34. Subsequently well known processes may be followed to fabricate discrete devices or integrated circuits in and over the device wafer layer. It is common to form dielectrically isolated device islands in the device-quality layer.

When processing is complete, the polysilicon layer 22 may be coated with a thermally grown oxide. This can be removed by a wet chemical etch with a buffered oxide etch or by a dry plasma etch with $CF_4$ or $SF_6$. Integrated circuits or discrete devices formed on the bonded wafer are then separated into die by laser ablation or sawing. The exposed polysilicon layer 22 is then solder attached to a copper heat sink as illustrated in FIG. 1F or eutectically attached to a gold plated package cavity as illustrated in FIG. 1G. The polysilicon layer 22 could also be attached to a heat sink or package material with a silver-glass adhesive having high thermal conductivity characteristics.

For solder attachment as illustrated in FIG. 1F, an aluminum layer 40 is bonded to polysilicon layer 22. A titanium layer 42 is formed as a diffusion barrier between the aluminum and a nickel layer 44. The nickel is coated with a gold layer 46 to preserve the otherwise exposed bonding surface from oxidation. To effect a bond between the Ni and the solder layer 48, e.g., Pb/Sn, the gold diffuses into the adjoining materials. The solder effects attachment of the die to a copper heat sink 50. The eutectic attachment of FIG. 1G is effected by placing a gold preform 52 in contact with the polysilicon layer 22 and the gold plating 56 of a package cavity. The system is heated at 425 C. to form a Au/Au bond.

Although conventional die attach techniques can be adapted to bond the polysilicon layer 22 of FIG. 1E to a package, other approaches are available to attach the diamond layer 12. The bonded wafer 28 of FIG. 1E need not be formed with the polysilicon layer 22. Rather, a direct bond could be formed between the diamond layer 12 and a nickel-plated package cavity with a silver epoxy adhesive such as Dupont 5504 cured at 150 C. for 16 hours. Also, materials other than polysilicon could form an intermediate layer between the diamond and the die attach media.

An advantage of the invention is that a diamond layer in a semiconductor-on-insulator bonded wafer can be formed under growth conditions entirely independent from the influences or constraints otherwise imposed by materials in the bonded wafer. For example, it is known that crystalline defects (e.g., stacking faults, micro twins and dislocations) and other imperfections such as grain boundaries, surface roughness and impurities, all influence the resultant properties in a CVD diamond film. The processes of nucleation and surface growth of diamond material on non-diamond substrates influence crystal orientation, intrinsic stress and morphology of the deposited film. Thus mechanical, electrical and thermal properties, including conductivity and the coefficient of thermal expansion, are, in part, determined by the choice of growth substrate. Specifically, transport behaviour of electrons in the diamond film, e.g., in response to ionizing radiation, applied voltage or impurity diffusion, is significantly influenced by the composition and structure of the interfacial layer between the growth substrate and the overlying diamond film.

BONDING BY SILICIDE

FIGS. 1H-1I illustrate in cross sectional view a preferred silicide bonding method of forming a silicon-on-free-standing-diamond bonded wafer. The process begins with a 500 micron thick silicon device wafer and a free standing diamond layer 12 of comparable diameter (as illustrated in FIG. 1E) having deposited polysilicon on both faces. Next deposit a 500 angstrom layer 24 of platinum or other refractory metal on the smooth surface of polysilicon layer 20. See FIG. 1H.

Next, join the device silicon wafer 30 and the free standing diamond layer 12 with the polysilicon and metal layers at the bonding interface. Heat the silicon-on-diamond structure to 500 C. in a 2-6 hour furnace cycle in an inert ambient such as nitrogen. This drives the metal to react with the silicon from the device wafer and the polysilicon of layer 22 to form silicide layer 26. This low temperature bonding results from a silicide reaction rather than thermal oxidation. See FIG. 1I. With platinum, silicon-platinum bonds form with silicon atoms from both the device silicon wafer 30 and the polysilicon layer 22. The bonded zone will have a thickness of roughly 600 to 1000 Angstroms. After bonding, the bulk of the silicon device wafer can be removed by grinding, lapping and polishing to leave the desired device silicon thickness. If other refractory metals such as tungsten and cobalt are used for the metal layer 24 instead of platinum, these may require a higher anneal temperature for the silicide reaction.

The device silicon wafer may be replaced with a gallium arsenide wafer for mating with a free standing diamond film. The polysilicon and platinum layers of the free standing diamond film are pressed against a layer, e.g., 500 Angstroms, of polysilicon deposited on the gallium arsenide wafer surface. A 500 C. two to six hour thermal cycle diffuses the platinum into the polysilicon layer on the GaAs and the polysilicon layer on the free standing diamond film. Again the bonding is dependent upon the silicidation reaction and not an oxidation. The advantage of the silicidation bonding with the GaAs to the free standing diamond film is that it is a low temperature bonding process which will not cause the unwanted decomposition of either the diamond or the GaAs. Both materials are stable well past 500 C.

In lieu of SiC a variety of materials may be selected for the growth substrate 10. Generally, once the diamond film is formed the growth substrate can be removed. For example, a tungsten substrate can be removed with a 30% peroxide ($H_2O_2$) solution by weight in water. A molybdenum or copper substrate can be removed with a 50% water solution of 70% mass concentration $HNO_3$ in water. Ni/Fe Alloy 42 can be removed by a 1:1 solution of Hcl (37% by mass) and $HNO_3$ (70% by mass). Kovar can be removed in the same manner as Alloy 42 or by a 97% assay of hot $H_2SO_4$.

The growth substrate 10 may also be formed as a composite structure 58, indicated schematically in FIG. 2, comprising a relatively thick base substrate 60, e.g., 500 microns, with a thin film 62 formed thereover to provide a growth surface 14 of choice. To prevent warpage of the substrate 60 due to differences in the coefficient of thermal expansion (CTE), a thin film 64 of like composition and thickness to film 62 (e.g., 0.05-1.0 micron) may be formed on the opposing side of the base substrate 60. Table I lists a series of choices for the base substrate 60 and thin film 62. Table I also indicates the CTE for the base substrate materials. Note, the CTE for polycrystalline diamond ranges from 2.0-2.3×E-6/C. For reasons now described, silicon nitride is an advantageous growth substrate material.

TABLE I

| BASE SUBSTRATES | BASE SUBSTRATE CTE (1E-6/°C.) | THIN FILMS | |
|---|---|---|---|
| Si | 2.3 | Ti | Zr |
| Mo | 5.0 | Ta | Hf |
| W | 4.5 | Cu | Ni |
| $Si_3N_4$ | 2.3 | Mo | $SiO_2$ |
| SiC | 3.7 | W | SiC |
| | | Pt | $Si_3N_4$ |
| | | Nb | |

During the production and processing of SOI wafers, semiconductor devices are formed according to processes generally employing high temperature ambient conditions. Diamond remains stable in an inert environment at temperatures near 1400 C. See J. E. Field, *The Properties of Diamonds*, New York Academic Press 1979. Once a diamond-containing structure such as bonded wafer 28 is formed, it is desirable to proceed with processing steps to form integrated circuit structures including device islands. When processing involves removal of wafer material such that the diamond layer becomes exposed, the process should employ an environment which is inert with respect to the diamond surface so that high-temperature conditions can be employed. This is because polycrystalline diamond becomes thermally unstable in an oxygen ambient at temperatures near 700 C. See Ramesham, et al., *J. Electrochem. Soc.*, Vol. 137, No. 10, October 1990, pages 3203–3205.

Although an inert atmosphere can preserve the integrity of the diamond at 700 C., such may not be suitable to a volume manufacturing environment, i.e., requiring a high degree of reliability, precision and repeatability. Generally it is believed that the susceptibility of diamond integrity to a reactive environment will render standard, high temperature, processes unsuitable. For example, silicon-based processing commonly employs thermal oxidation of silicon at temperatures in excess of 700 C. in order to create a wide variety of oxides, e.g., field oxide, trench oxide, ion implantation mask oxide, gate oxide and capacitor oxide. Such reactions would affect the diamond material. Alternatives such as oxide deposition are not desirable in volume manufacture.

Furthermore, when diamond material is in direct contact with semiconductor material such as silicon, there exists the possibility of carbon diffusion into the semiconductor. Diffusion resulting in carbon concentrations on the order of 1E18 atoms per cm$^3$ can cause formation of microdefects and dislocations which will likely degrade minority carrier lifetime. See K. V. Ravi, *Imperfections and Impurities in Semiconductor Silicon*, Wiley: New York, 1981.

A method and structure are now described for protecting the integrity of diamond material during standard silicon processing, including oxide formation and deposition. An important feature associated with the method and structure is the reduction of carbon migration into the semiconductor material by an intervening dense material such as $Si_3N_4$.

Figure 3:
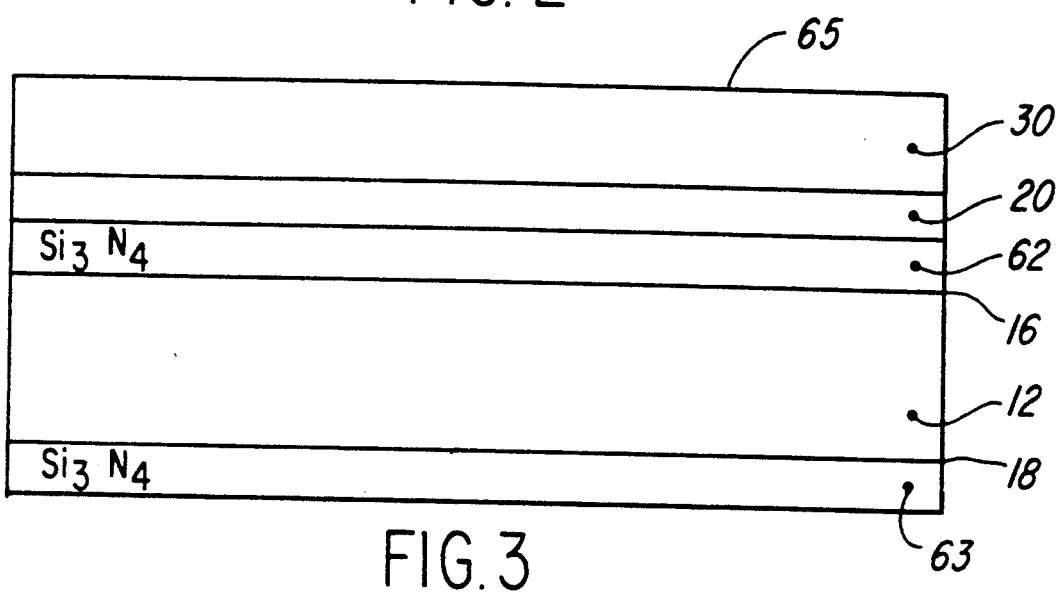
FIG. 3 illustrates silicon nitride layers formed on diamond material.

The structure of FIG. 3 may result by selection of silicon nitride as the thin film 62 of a composite structure. For example, with a laminate arrangement such as described in FIG. 2, the diamond layer 12 may be formed on a substrate 10 comprising two thin films 62 and 64 of silicon nitride formed over opposing sides of a Mo base substrate 60. Before formation of an intermediate bonding layer, e.g., like polysilicon layer 20, the Mo base substrate is removed with a solution of $HNO_3$ as previously described, leaving a thin film of silicon nitride denoted as layer 62 in FIG. 3. The silicon nitride layer 62 serves as both an oxidative and a diffusion barrier to protect the diamond surface 16 during device formation. A second silicon nitride layer 63 may be formed on the diamond surface 18 to provide an oxidative barrier as well.

The choice of silicon nitride for the layer 62 is exemplary. Other materials may be suitable depending on the selection of materials for the device wafer 30 as well as the specific process conditions. Generally, the layer 62 should comprise one or more materials which provide an effective barrier to oxidation and/or diffusion of oxygen into the diamond. Note, unlike silicon dioxide, silicon nitride contains no oxygen which could migrate from the barrier layer itself into the diamond material.

A second desired feature is that the layer 62 should prevent diffusion of active dopant into the semiconductor material of the device wafer 30. Carbon acts as a dopant in silicon. Unlike silicon nitride, materials such as boron nitride and aluminum nitride contain elements, e.g., boron and aluminum, which act as dopants in silicon. Thus, choice of material for the layer 62 is, in part, dependant on the choice of semiconductor material for the device wafer 30.

A silicon nitride barrier film can also be formed independent from the diamond growth process. Beginning with a free-standing diamond film 12 such as previously described with reference to FIG. 1B, deposit the 300–500 Angstrom layer 62 of silicon nitride on the smooth diamond surface 16 (formerly bonded to a growth substrate) by reacting dichlorosilane with ammonia at 800 C. In addition, in lieu of a polysilicon layer 22 as illustrated in FIG. 1D, the second silicon nitride layer 63 may be deposited along the diamond layer surface 18. The polysilicon layer 22 (FIG. 1D) and the nitride layer 63 both provide an oxidative barrier to protect the integrity of the diamond layer 12 during thermal processing. Next, over the silicon nitride layer 62 deposit an intermediate bonding layer 20, e.g., comprising approximately 500 angstroms of polysilicon or amorphous silicon. The layer 20 can be formed by low pressure chemical vapor deposition at a temperature in the range of 600 C. See FIG. 3. The silicon nitride layer 62 provides both an oxidative and diffusion barrier with respect to the overlying polysilicon layer 20 and a subsequently bonded device wafer 30 during device formation. If nitride has not been deposited on the surface 18, deposit a two micron thick polysilicon layer.

Bonding with the device wafer 30 proceeds as previously described with reference to FIG. 1E to form a bonded wafer structure 65. For example, place a required number of drops of oxidizing liquid either with or without a dopant on the smooth, 500 angstrom polysilicon layer 20. Press the device wafer to the polysilicon surface containing the oxidizing liquid and thermally anneal this structure at 900° C. to produce oxidative bonding. Wafer processing may proceed as described elsewhere to complete an integrated circuit. See Ser. No. 07/921,197. When processing is complete, remove any grown oxides from the back surface of the diamond film. Wafers can then be laser ablated or sawn into individual die.

With a semiconductor-on-diamond bonded wafer structure, including silicon nitride layer 62 (but not necessarily layer 63), formation of device islands may proceed as illustrated in FIGS. 4A-4F. For an exemplary bonded wafer structure 90 (FIG. 4A) lateral isolation begins with formation of a thermal oxide 92 over a device silicon layer 94. The silicon layer 94 is bonded to a diamond substrate 96 through intervening silicon nitride layer 98 (corresponding to layer 62 of FIG. 3) and through polysilicon layer 100 (corresponding to layer 20 of FIG. 3). Depending on the bonding reaction, a very thin (e.g., 10 to 30 Angstroms silicide or oxide) bond interface layer 102, will be present between the device silicon layer 94 and the diamond substrate 96. See application Ser. No. 07/939,786.

The $SiO_2$ layer 92 is patterned with an oxide etch, preferably a Reactive Ion Etch (RIE), forming vertical oxide sidewalls. Next, a dry etch is performed in the device layer extending into the polysilicon layer 100. Removal of material in the device and polysilicon layers to form the trench 104 is preferably accomplished with a two step etch. A breakthrough isotropic plasma etch removes native oxide and carbon matter. Next, the main etch, RIE, is anisotropic in nature. Etch conditions are summarized in Table 2.

TABLE 2

| DESCRIPTION | STEP I (BREAKTHROUGH) | STEP II (MAIN ETCH) |
|---|---|---|
| HBr(sccm) | 20 | 22 |

TABLE 2-continued

| DESCRIPTION | STEP I (BREAKTHROUGH) | STEP II (MAIN ETCH) |
|---|---|---|
| SiF$_4$(sccm) | — | 5 |
| He/O$_2$(sccm) | — | 8-12 |
| NF$_3$(sccm) | 5 | — |
| Pressure(mtorr) | 20 | 100 |
| B-Field(Gauss) | 0 | 55 |
| Power(Watts) | 450 | 400 |
| time(sec) | 60 | 800 |

If an oxide, rather than silicide, bond layer is present between the device silicon layer 94 and the nitride layer 98, the etch proceeds through the bond layer 102 to the silicon nitride layer 98. Alternately, if layer 102 is silicide, the etch may stop on the silicide. Silicide removal can be effected by a 1:1 wet etch solution of HCl:HNO$_3$. Residual of layer 100 (polysilicon), if present, is removed by a dry etch (Table 2 Step II). An HF dip will remove the masking oxide.

After formation of the trench 104, the oxide mask layer 92 is removed by an HF dip which further removes residual oxides. Next, silicon dioxide layer 106 is formed along the trench walls, e.g., by plasma enhanced CVD of tetraethylorthosilicate (TEOS) at 400 C. The deposited SiO$_2$ is densified at about 1000 C. in N$_2$.

Figure 4A:
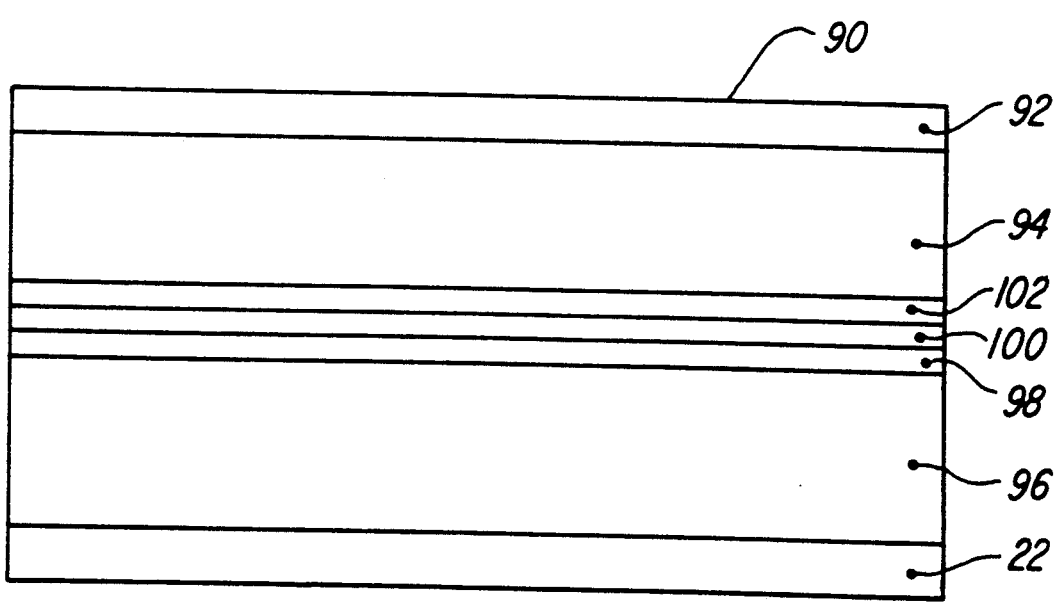
FIG. 4A–4F provide, in sequence, partial views of a silicon-on-diamond structure during device island formation.
Figure 4B:
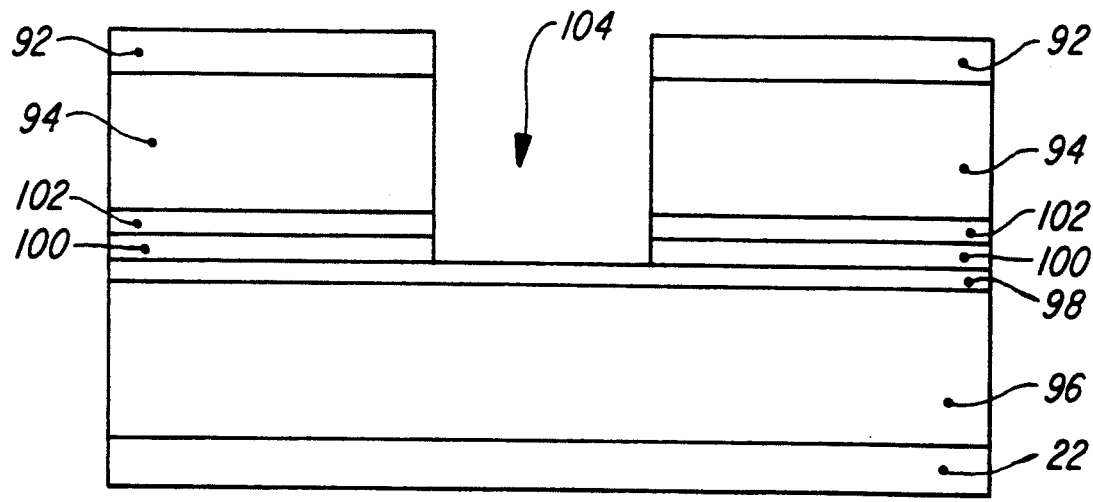
Figure 4C:
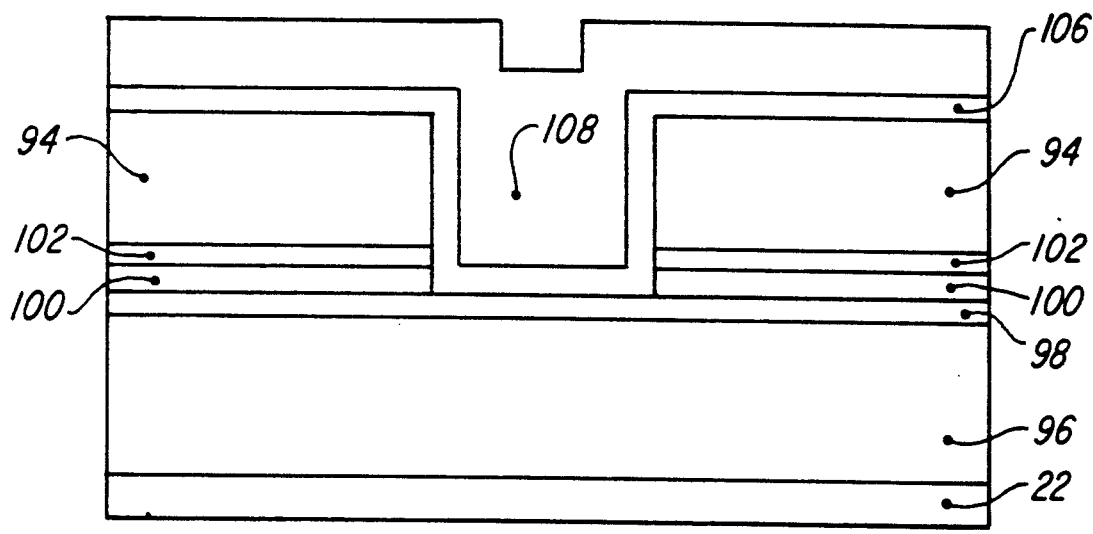
Figure 4D:
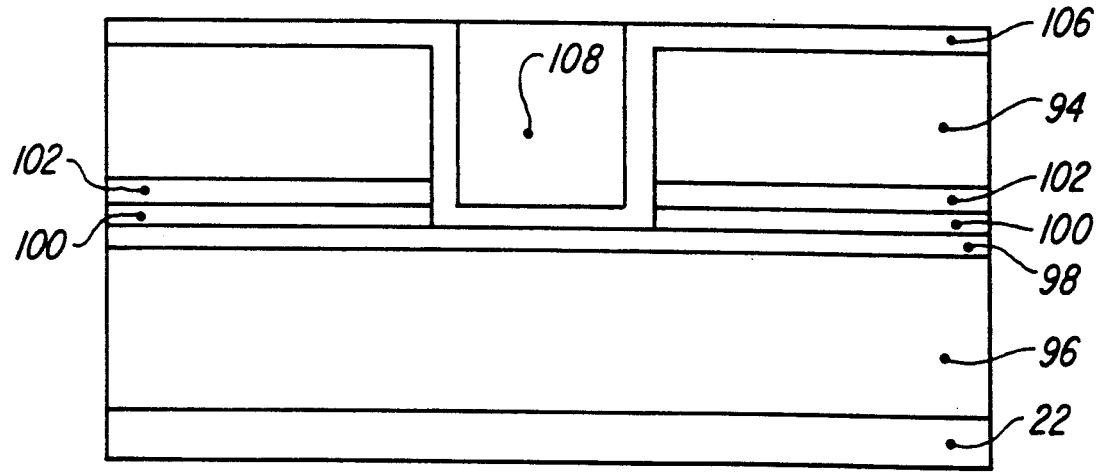
Figure 4E:
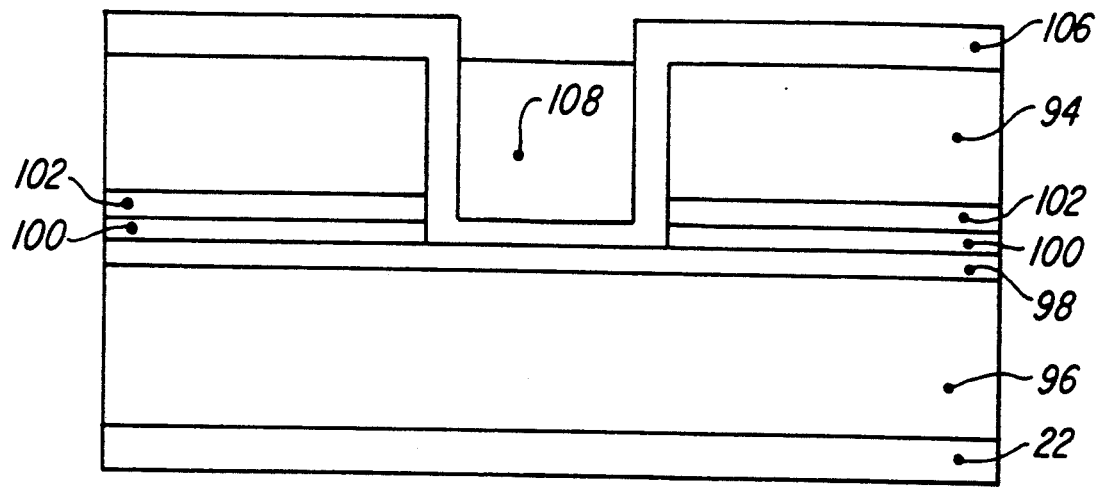

After deposition of the SiO$_2$ by TEOS a thick, e.g., 2 micron, polysilicon layer 108 is deposited by LPCVD. Deposition thickness should be adjusted to completely fill the trench as shown in FIG. 4C. The LPCVD polysilicon is removed from the wafer surface by chemical/mechanical polishing. The polish stops on the densified SiO$_2$ layer 106. See FIG. 4D. Next, polysilicon is removed from the trench 104 down to the upper surface 103 of the device silicon layer 94 with a timed reactive ion etch (e.g., Step II of Table 2), or wet etchant (HNO$_3$+HF). See FIG. 4E. Finally, the TEOS-deposited SiO$_2$ layer 106 remaining over the device layer 94 is removed with a plasma etch (e.g., see Step I of Table 2) to provide the resulting structure of FIG. 4F.

Figure 4F:
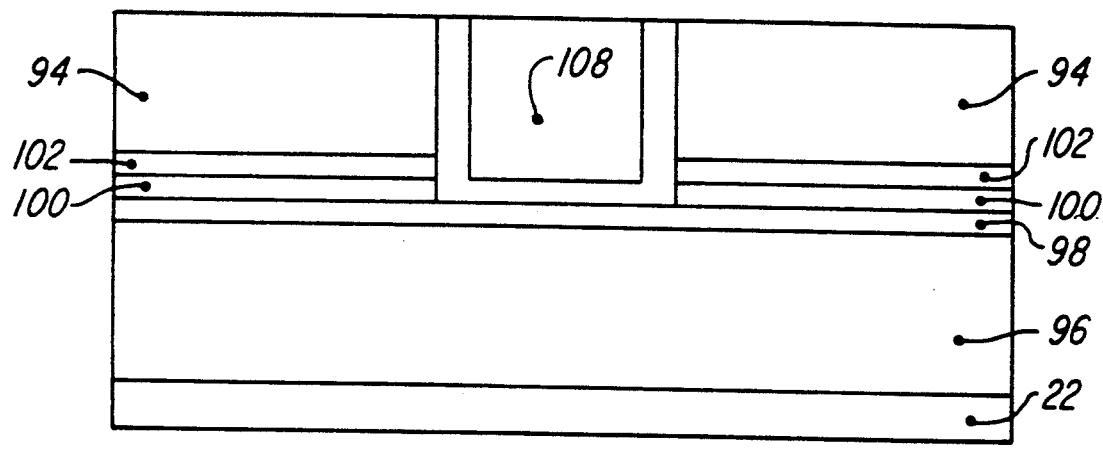
Figure 5A:
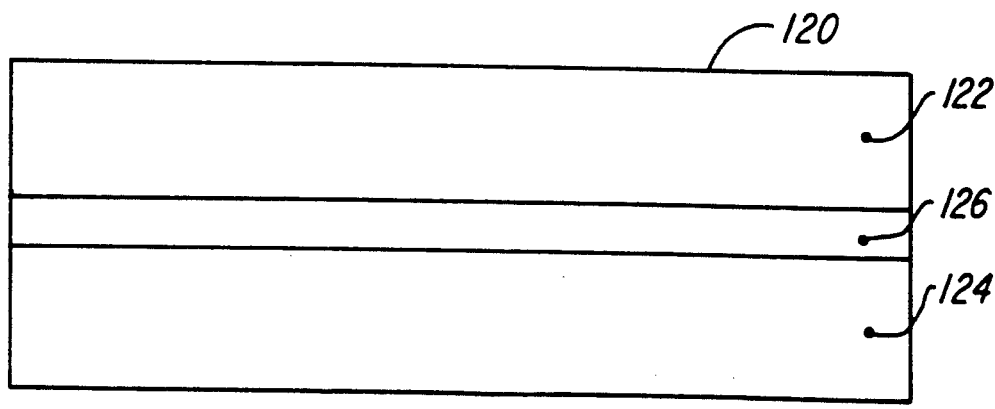
FIGS. 5A–5G illustrate in partial view a method of incorporating silicon nitride on diamond material when forming device islands.
Figure 5B:
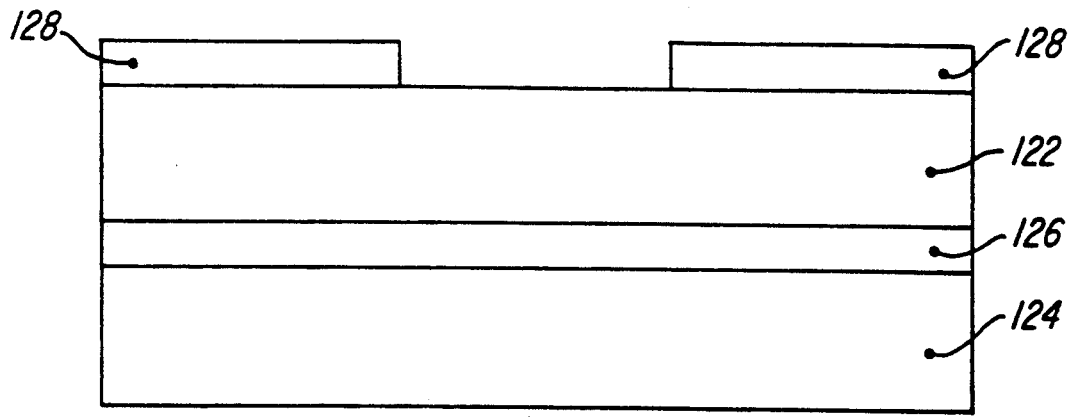

As illustrated in FIG. 4F, the above-process is capable of providing a continuous silicon nitride layer underlying both the trenches and the portions of the device silicon layer which become isolated device islands. Alternately, when the diamond substrate is bonded to the device silicon layer without an intervening nitride layer (e.g., with an intermediate polysilicon layer and either a bonding oxide or a bonding silicide), it is desirable to protect diamond material which may be exposed to an oxidizing ambient during trench formation. FIG. 5A illustrates such a bonded wafer 120 comprising a device silicon layer 122 bonded to a diamond layer 124 by an intervening bonding layer 126 comprising, for example, oxide or silicide. Trench formation begins with thermal growth of oxide on the silicon layer 122 followed by pattern and mask steps resulting in the masking oxide layer 128 (FIG. 5B). Next, an etch is performed such as described in Table 2. When the bonding layer 126 is oxide the etch penetrates therethrough to stop on the diamond layer 124. As discussed with reference to FIGS. 4 when the layer 126 is silicide, the RIE stops thereon (See FIG. 5C) and the silicide is removed with a wet chemical etch to expose the diamond. An HF dip will also remove the masking oxide. FIG. 5D illustrates the resulting trench 129 after removal of both layer 126 and oxide mask 128.

Next, a 500 Angstrom layer 130 of silicon nitride is deposited in the resulting trench 129 and over the device silicon layer 122. The nitride layer 130 is annealed at 800 C. to remove silicon defects and form a thin oxide layer 134 along the nitride surface, e.g., less than 20 angstroms. The thin layer 134 provides a good bonding surface for receiving deposited silicon dioxide or polysilicon during subsequent trench refill steps. That is, TEOS SiO$_2$ and LPCVD polysilicon are deposited to refill the trench as previously described with reference to FIG. 4C. See FIG. 5F which further illustrates the TEOS oxide layer 138 and the polysilicon fill layer 140. With chemical/mechanical polishing the structure shown in FIG. 5G results.

Figure 5C:
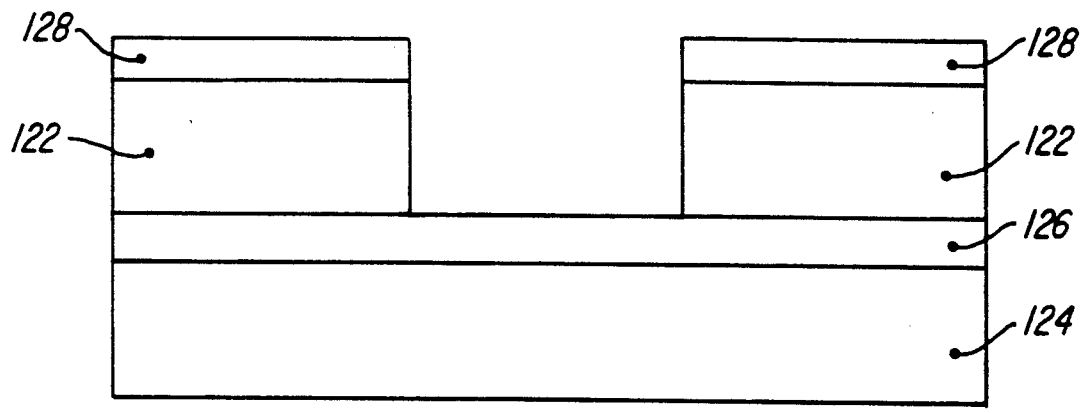
Figure 5D:
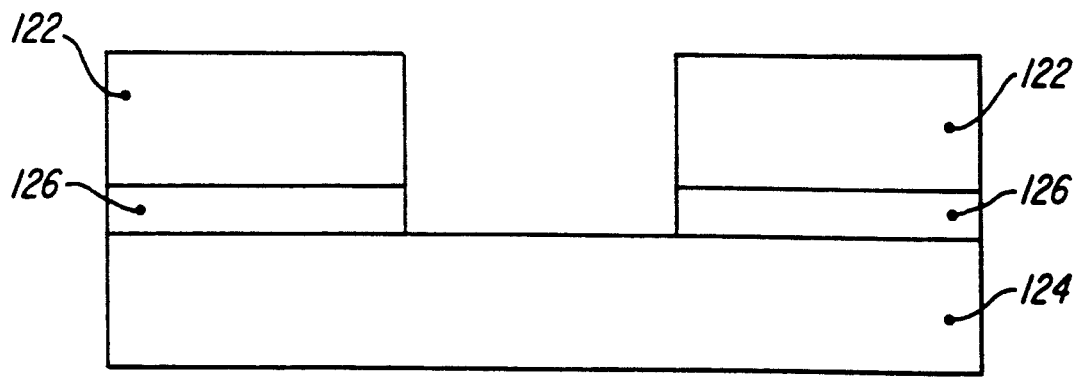
Figure 5E:
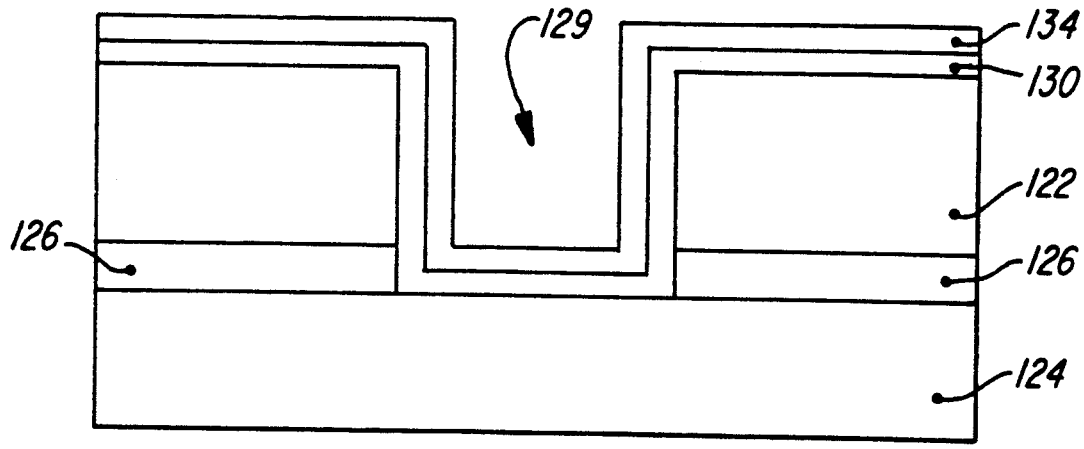
Figure 5F:
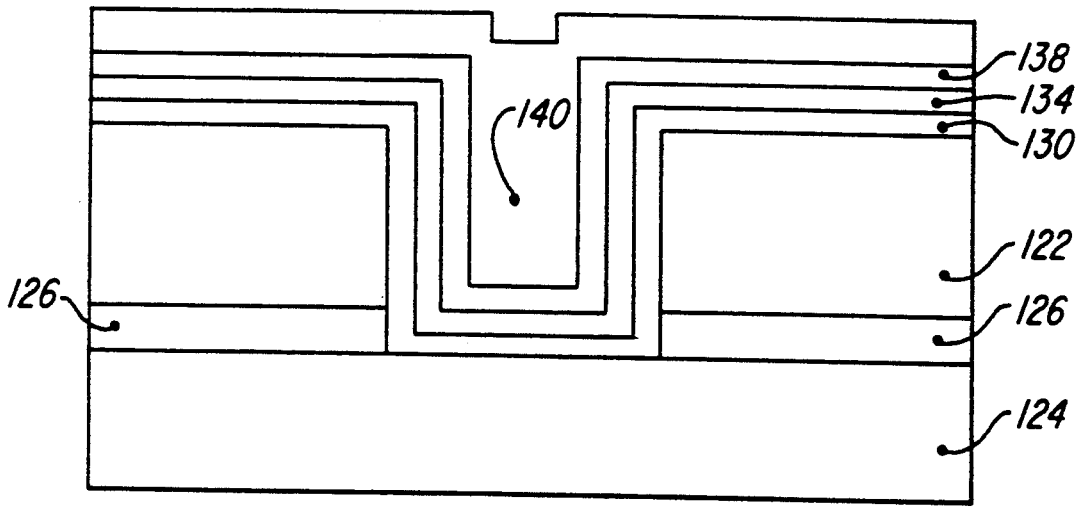
Figure 5G:
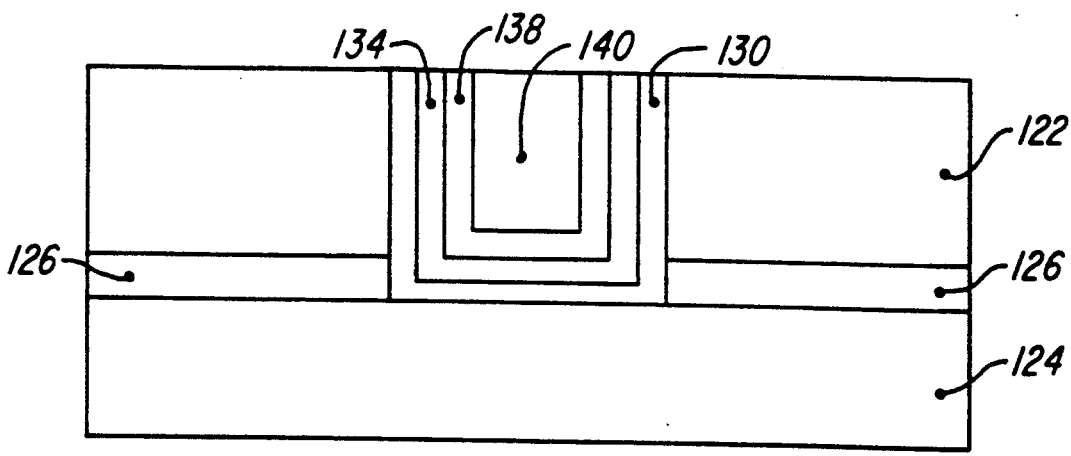
Figure 6A:
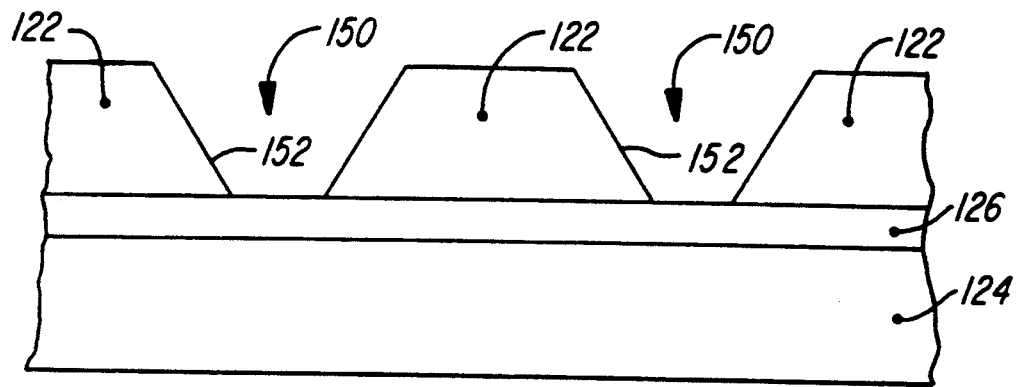
FIGS. 6A–6D illustrate in partial view still another sequence for fabricating device islands.
Figure 6B:
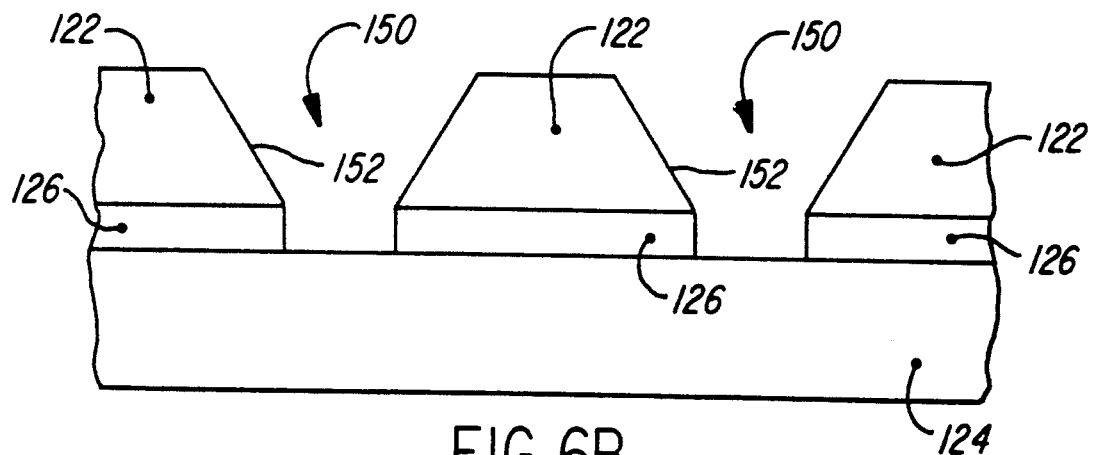
Figure 6C:
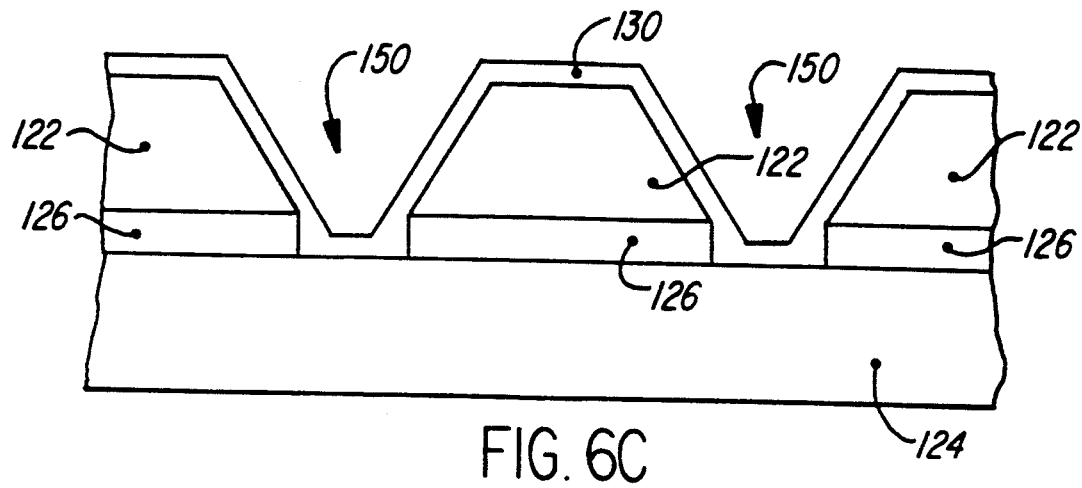
Figure 6D:
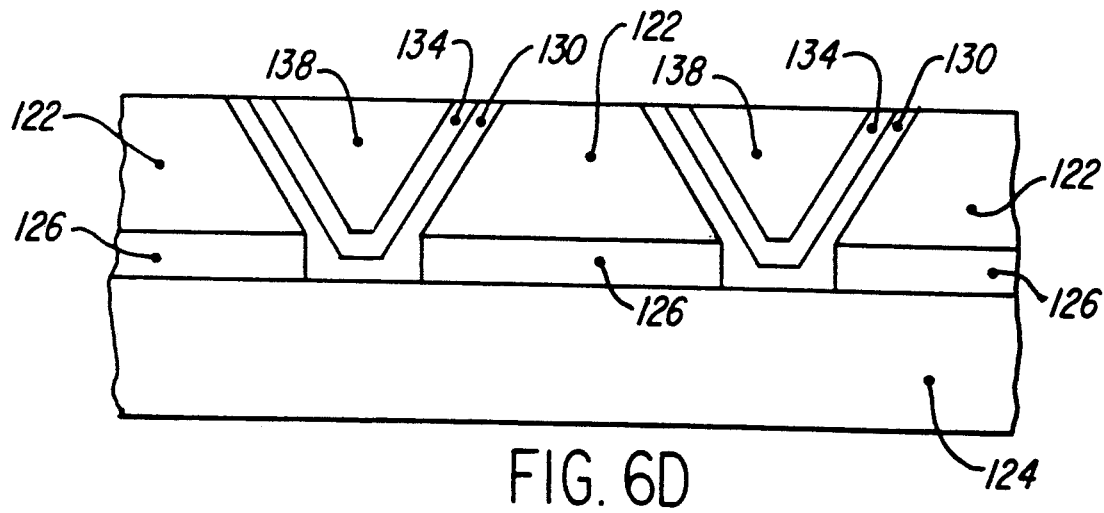

As an alternate embodiment to the fabrication sequence of FIG. 5, the trench formation of FIG. 5C, achieved with a dry etch, can be effected with a wet anisotropic etch in a KOH-n-propanol solution (85 C.). See FIG. 6A which illustrates trenches 150 formed in the device silicon layer 122 wherein the upper surface of the layer 122 is along the 1,0,0 lattice plane. The wet etch exposes trench walls 152 along the 1,1,1 plane at a slope of 54.7 degrees relative to the 1,0,0 plane. For many bipolar device applications a suitable thickness for the remaining island portions of the device layer ranges from 10 to 20 microns. The KOH etch will stop on the bonding layer 126. To expose the underlying diamond layer 124, removal of an oxide bonding layer is achieved with an HF wet etch while removal of a silicide bond can be had with aqua regia. See FIG. 6B. The process continues as described above with reference to FIGS. 5E-5G. That is, a silicon nitride layer 130 is deposited (FIG. 6C) and annealed to provide a receiving surface for SiO$_2$ and/or polysilicon. The resulting structure (analogous to that shown in FIG. 5G) is illustrated in FIG. 6D.

Based on the above recitations, it is apparent that the present invention may be embodied in a variety of specific forms and the foregoing disclosed embodiments are therefore to be considered in all respects as illustrative and not restrictive. The scope of the invention is commensurate with the claims appended hereto and is not to be otherwise limited. All variations which come within the meaning and range of equivalency of the claims are intended to be embraced therein.

What is claimed is:

1. A method for preparing a semiconductor-on-insulator structure comprising the steps of:
   a. providing a removable deposition surface and forming a layer of crystalline diamond material thereon, the layer including first and second opposing surfaces with the first surface in contact with the deposition surface;
   b. separating the first surface of the diamond layer from the deposition surface;
   c. providing a wafer structure having first and second opposing surfaces, said structure including a semiconductor layer along the first surface; and
   d. forming a bond between one of the diamond layer surfaces and the second surface of the wafer structure.

2. The method of claim 1 wherein the diamond layer is separated from the deposition surface before forming the bond between the one diamond layer surface and the wafer structure.

3. The method of claim 1 wherein the semiconductor layer comprises silicon and bond formation is effected by:
   depositing silicon on the first diamond surface; and placing the second surface of the wafer structure against the deposited silicon.

4. The method of claim 1 wherein bond formation is effected by:
   depositing a layer of silicon on the first diamond surface;
   depositing a metal layer over the silicon layer;
   placing the wafer structure against the metal layer; and
   reacting to form a metal silicide bond between the diamond layer and the semiconductor layer of the wafer structure.

5. The method of claim 1 wherein the step of forming the bond includes:
   forming a layer of silicon nitride on the first diamond surface; and
   forming a layer of silicon over the silicon nitride layer.

6. The method of claim 5 further including:
   forming a metal layer over the layer of silicon;
   positioning the wafer structure against the metal layer; and
   heating to form a silicide bond.

7. The method of claim 1 wherein the bond is formed between the first diamond surface and the semiconductor layer of the wafer structure.

8. A method of forming a semiconductor-on-insulator structure comprising the steps of:
   providing a diamond layer having first and second surfaces;
   forming a silicon nitride layer on one of the diamond layer surfaces; and
   bonding a layer comprising monocrystalline semiconductor material to the diamond layer with the silicon nitride layer positioned between the diamond layer and the semiconductor material.

9. The method of claim 8 wherein the step of bonding includes:
   depositing a layer of silicon on the silicon nitride layer; and
   reacting the deposited silicon.

10. The method of claim 9 wherein the step of bonding further includes depositing a metal layer over the deposited silicon; and the reaction forms a silicide bond with the layer comprising semiconductor material.

11. The method of claim 9 wherein a silicon dioxide bond is formed between the deposited silicon and the layer comprising semiconductor material.

12. The method of claim 8 further including:
   forming a plurality of trenches extending from an upper surface of the semiconductor material to expose the silicon nitride layer, said trenches defining electrically isolated semiconductor islands suitable for device formation.

13. The method of claim 8 wherein the monocrystalline semiconductor material is predominantly silicon.

14. A method of forming a semiconductor-on-insulator structure comprising the steps of:
   providing a diamond layer having first and second surfaces;
   bonding a first layer comprising monocrystalline semiconductor material to one of the diamond layer surfaces;
   forming trenches extending from an upper surface of the semiconductor layer to expose the diamond layer; and
   depositing silicon nitride over the exposed diamond layer.

15. The method of claim 14 wherein said first layer comprising semiconductor material is bonded to the diamond layer by depositing silicon over the diamond layer and forming a silicon dioxide bond between said first layer and the deposited silicon layer.

16. The method of claim 14 wherein the step of bonding includes formation of a metallic silicide between said first layer and the diamond layer.

17. The method of claim 14 wherein said first layer predominantly comprises a monocrystalline silicon lattice structure with trenches formed along 1,1,1 planes thereof.

* * * * *